United States Patent
Hashimoto et al.

(10) Patent No.: US 6,778,124 B2
(45) Date of Patent: Aug. 17, 2004

(54) LOW POWER, HIGH SPEED ANALOG TO DIGITAL CONVERTER

(75) Inventors: Yasuyuki Hashimoto, Sagamihara (JP); Hiroyuki Okada, Sagamihara (JP)

(73) Assignee: Semiconductor Technology Academic Rsearch Center, Yokohama (JP)

( * ) Notice: Subject to any disclaimer, the term of this patent is extended or adjusted under 35 U.S.C. 154(b) by 0 days.

(21) Appl. No.: 10/323,143

(22) Filed: Dec. 18, 2002

(65) Prior Publication Data

US 2003/0179120 A1 Sep. 25, 2003

(30) Foreign Application Priority Data

Mar. 22, 2002 (JP) ......................................... 2002-081042

(51) Int. Cl.⁷ ................................................ H03M 1/12
(52) U.S. Cl. ...................... 341/155; 341/120; 341/154; 341/159
(58) Field of Search ............................... 341/120, 118, 341/159, 155, 154

(56) References Cited

U.S. PATENT DOCUMENTS

| | | | | |
|---|---|---|---|---|
| 4,395,732 A | * | 7/1983 | Upton ......................... | 341/120 |
| 5,184,130 A | * | 2/1993 | Mangelsdorf ............... | 341/156 |
| 5,210,537 A | * | 5/1993 | Mangelsdorf ............... | 341/156 |
| 5,214,430 A | * | 5/1993 | Gulczynski ................. | 341/159 |
| 5,293,169 A | * | 3/1994 | Baumgartner et al. ...... | 341/172 |
| 5,329,281 A | * | 7/1994 | Baumgartner et al. ...... | 341/139 |
| 5,382,956 A | * | 1/1995 | Baumgartner et al. ...... | 341/155 |
| 5,436,629 A | * | 7/1995 | Mangelsdorf ............... | 341/156 |
| 5,467,090 A | * | 11/1995 | Baumgartner et al. ...... | 341/155 |
| 5,663,728 A | * | 9/1997 | Essenwanger ............... | 341/153 |
| 5,668,549 A | * | 9/1997 | Opris et al. ................. | 341/118 |
| 5,668,551 A | * | 9/1997 | Garavan et al. ............. | 341/120 |
| 5,760,720 A | * | 6/1998 | Nolan et al. ................. | 341/120 |
| 5,861,829 A | | 1/1999 | Sutardja | |
| 6,177,901 B1 | * | 1/2001 | Pan et al. .................... | 341/155 |
| 6,411,233 B1 | | 6/2002 | Sutardja | |
| 6,661,365 B1 | * | 12/2003 | Bugeja ........................ | 341/160 |

FOREIGN PATENT DOCUMENTS

JP        10-65542        3/1998

* cited by examiner

Primary Examiner—Michael Tokar
Assistant Examiner—Lam T. Mai
(74) Attorney, Agent, or Firm—Christie, Parker & Hale LLP

(57) ABSTRACT

A low power consumption, high conversion accuracy, and high speed operation analog/digital converter, that is, a flash-type analog/digital converter provided with a top voltage comparator TC, a bottom voltage comparator BC, a switch circuit $S_i$ ($1 \leq i \leq M$), a timer TM, a sweep generator SG, and a controller CO. At the start of calibration, a predetermined switch among the switch circuits is turned on to apply a predetermined reference voltage to the other terminal of a comparators $C_i$ and to apply a calibration voltage changing in a ramp shape from a sweep generator to one terminal of the comparator $C_i$. Further, the inversion time of the comparator $C_i$ is counted by the timer, the reference voltage is reselected, and the switch to be turned on is determined based on the results of the count.

8 Claims, 9 Drawing Sheets

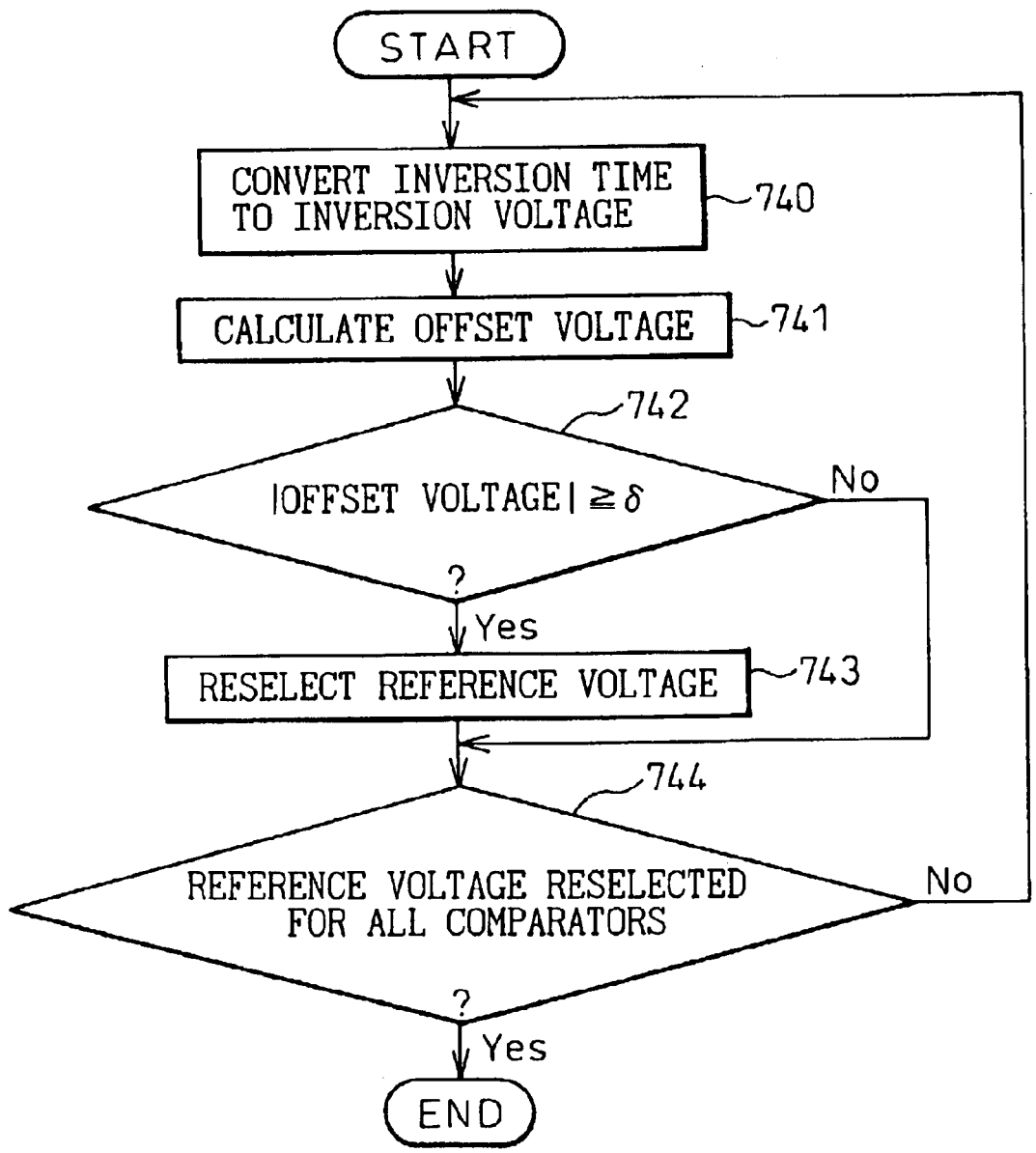

LOW POWER, HIGH SPEED ANALOG TO DIGITAL CONVERTER

CROSS-REFERENCE RELATED APPLICATION

This application claims priority of Japanese Patent Application Number 2002-081042, filed Mar. 22, 2002.

BACKGROUND OF THE INVENTION

1. Field of the Invention

The present invention relates to an analog/digital converter, more particularly relates to a low power consumption, high conversion accuracy, high speed operation analog/digital converter.

2. Description of the Related Art

Analog/digital converters are widely used in various fields for converting analog signals to digital signals.

There are various forms of analog/digital converters. As a high speed operation type, generally a flash type is used.

A flash type analog/digital converter converts an input voltage $V_i$ between a top voltage $V_T$ and a bottom voltage $V_B$ to an N-bit digital signal and uses a reference voltage output circuit comprised of M number of dividing resistances $R_1$ to $R_M$ dividing the range between the top voltage $V_T$ and the bottom voltage $V_B$ into $M=2^N$ connected in series.

(M−1) number of voltage division points are connected to one-side terminals (for example, negative input terminals) of (M−1) number of comparators $C_1$ to $C_{M-1}$. The other terminals (for example, positive input terminals) of the comparators $C_1$ to $C_{M-1}$ are connected in common. The input voltage $V_i$ is applied to the common terminal.

That is, when the input voltage $V_i$ is larger than $V_B+(V_T-V_B)/M$ and smaller than $V_B+2(V_T-V_B)/M$, only the comparator $C_1$ arranged at the bottommost voltage $V_B$ side is inverted. The other comparators $C_2$ to $C_{M-1}$ maintain their non-inversion states.

In general, when the input voltage $V_i$ is larger than $V_B+(V_T-V_B)\cdot(m-1)/M$ and smaller than $V_B+(V_T-V_B)\cdot m/M$, the comparators $C_1$ to $C_{m-1}$ at the bottom voltage $V_B$ side are inverted and the remaining comparators $C_m$ to $C_{M-1}$ maintain their non-inversion state (where, m=1, 2 . . . M).

Further, the outputs of the comparators $C_1$ to $C_{M-1}$ are connected to the encoder EN. The outputs of the (M−1) number of comparators are output encoded to an N-bit digital signal.

The parts of the flash-type analog/digital converter are built into an integrated circuit, but the resistance values of the M number of dividing resistances and the offsets of the (M−1) number of comparators vary and a drop in the conversion accuracy is unavoidable.

FIG. 2 is a view explaining the operating characteristic of a comparator. The abscissa indicates the differential voltage between an input voltage $V_i$ applied to a positive input terminal and a divided voltage applied to the negative input terminal, while the ordinate indicates the output of the comparator.

Comparators are produced designed so as to invert in output at a differential voltage of 0V, but sometimes the inversion voltage deviates from 0V due to variations at the time of fabrication of the integrated circuit. This deviation is called "offset".

To prevent a decline in the conversion accuracy due to variation in offset, the technique is proposed of building a plurality of (for example, three) comparators into each of the comparators $C_1$ to $C_{M-1}$ and selecting the comparator giving the smallest offset for the conversion in the inspection or calibration process.

Even if building in a plurality of comparators, there is no guarantee that there will be a comparator with an offset of 0V. There are therefore limits to the improvement of the conversion accuracy.

Therefore, to improve the conversion accuracy, it is proposed to divide each of M number of dividing resistances $R_1$ to $R_M$ into a plurality of resistances and select the division position for supplying a reference voltage to a comparator in the inspection or calibration process to minimize the offset of that comparator (see Japanese Unexamined Patent Publication (Kokai) No. 10-65542).

FIG. 3 is a view of the configuration of an analog/digital converter of the related art to which the above technology is applied. The dividing resistances $R_1$ and $R_M$ are divided into two resistances, while the dividing resistances $R_2$ to $R_{M-1}$ are divided into three resistances. Further, three adjoining resistances are connected through a switch to one of the terminals of each of the comparators $C_1$ to $C_{M-1}$.

On the other hand, M+1 number of reference voltages including the top voltage $V_T$ and bottom voltage $V_B$ are fed back through the switches to the input voltage terminals. Further, the output of the encoder is led to a switch control circuit SC. The switch control circuit SC controls the operation of the switches arranged between the dividing resistances and comparators and the switches for feeding back the dividing resistances to the input voltage terminals.

Further, at the calibration mode, the circuit feeds back one of the divided voltages to the input voltage terminals and selects the dividing resistances for connection to the comparators so that the corresponding comparators invert at a predetermined standard reference voltage.

Summarizing the problems to be solved by the invention, the following problems occur in an analog/digital converter of the above configuration:

(1) It is necessary to select the connection point for each comparator, so when the number of bits of the analog/digital converter is increased, time is taken for selection of the connection points.

Further, it is necessary to take into consideration the time from when switching the switches to when the outputs of the comparators stabilize, so the time required for selection of the connection points becomes further longer.

(2) If reducing the power supply voltage for reducing the power consumption of the analog/digital converter, sometimes the connection points cannot be determined.

That is, when reducing the voltage, the differential voltage between the top voltage $V_T$ and the bottom voltage $V_B$ becomes small, so the dynamic range of the input voltage also becomes small. As opposed to this, the offsets of the comparators are determined by the method of production of the integrated circuit, so the offsets become relatively large.

In the analog/digital converter of the above configuration, however, since the connection points have to be determined from limited ranges centered around standard connection points (in this embodiment, the standard connection division point and two division points above and below the same), when the offsets are large, sometimes the offsets cannot be corrected even when changing the connection points.

For example, if the differential voltage between the top voltage $V_T$ and the bottom voltage $V_B$ is $V_d$ and the number of bits of the digital output is N, the voltage corresponding to the least significant bit (LSB) becomes $V_d/2^N$.

When forming the comparators in an integrated circuit, the offsets are liable to become as high as 40 mV. In the analog/digital converter of the above configuration, however, the adjustable range of offset becomes 1 LSB, that is, 40 mV, so the power supply voltage must become more than $40 \cdot 2^N$ mV.

For example, when N=6, the power supply voltage has to be more than 40·64=2560 mV=2.56V. An analog/digital converter having a power supply voltage of 1V cannot be made.

(3) Further, since the analog/digital converter of the above configuration controls the connection and division points based on the results of encoding of the outputs of the comparators by the encoder EN, it is not possible to detect scrambling of the operating sequence of the comparators.

That is, in a flash-type analog/digital converter of the related art, the comparators have to sequentially invert along with a change in the input voltage, but sometimes the inversion sequence becomes scrambled due to the offset. For example, when the input voltage gradually rises, the comparators should invert in the sequence of $C_{m-1} \to C_m \to C_{m+1}$, but when the offset of the comparator $C_m$ is large, sometimes the comparator $C_m$ will not invert and the other comparators will invert in the sequence of $C_{m-1}$ to $C_{m+1}$.

In the analog/digital converter of the above configuration, however, sometimes it is not possible to correctly recognize scrambling of the inversion sequence since the outputs of the comparators are encoded and the connection and division points are switched.

SUMMARY OF THE INVENTION

An object of the present invention is to provide a low power consumption, high conversion accuracy, and high speed operation analog/digital converter.

According to the present invention, there is provided an analog/digital converter for converting an analog voltage to N bits of a digital signal, comprising $(2^N-1)$ number of comparing means; a reference voltage outputting means for dividing a differential voltage of a top voltage and bottom voltage into at least $(2^N)$ number of sections and outputting at least $(2^N+1)$ number of reference voltages including said top voltage and bottom voltage; a calibration voltage outputting means for outputting a ramp-like voltage to one-side input terminals of said $(2^N-1)$ number of comparing means at a calibration mode; a calibrating means for selecting a voltage to be supplied to the other input terminal of one predetermined comparing means making that comparing means invert from the at least $(2^N+1)$ number of reference voltages output from said reference voltage outputting means when the output voltage of said calibration voltage outputting means reaches each of the $(2^N-1)$ number of reference inverted voltages set in the design at a calibration mode; and a reference voltage applying means for applying a reference voltage selected by said calibrating means to the other terminals of the above $(2^N-1)$ number of comparing means.

In the present invention, a reference voltage making the offset of the calibrating means less than a predetermined threshold by application of a ramp-like calibration voltage to the comparing means is selected.

Preferably, said calibrating means comprises a reference voltage selecting means for selecting one predetermined voltage from the at least $(2^N+1)$ number of reference voltages output from said reference voltage outputting means and applying it to the other terminals of said $(2^N-1)$ number of comparing means; a calibration voltage range detecting means for detecting if the output voltage of said calibration voltage outputting means is in a predetermined range from said bottom voltage to said top voltage; an inversion time counting means for counting the time (inversion time) from when the output voltage of said calibration voltage outputting means becomes more than said bottom voltage to when the outputs of said $(2^N-1)$ number of comparing means invert when inversion of said $(2^N-1)$ number of comparing means is detected by said calibration voltage range detecting means while the output voltage of said calibration voltage detecting means is in said predetermined range; a converting means for converting an inversion time counted by said inversion time counting means to an inversion voltage after the fact that the output voltage of said calibration voltage outputting means has become more than said top voltage is detected by said calibration voltage range detecting means; and a reference voltage reselecting means for reselecting a voltage to be applied to the other terminals of said $(2^N-1)$ number of comparing means from the at least $(2^N+1)$ reference voltages of said reference voltage outputting means when a differential voltage of the inversion voltage calculated by said converting means and the reference voltage selected by said reference voltage selecting means and applied to the other terminals of said $(2^N-1)$ number of comparing means is a predetermined threshold voltage or more.

In the present invention, in the state with a predetermined reference voltage applied to the other terminals of the comparing means, a ramp-like calibration voltage is applied, the inversion times of the comparing means are counted, and the reference voltage to be applied to the other terminals of the comparing means is reselected based on the results of the counting.

More preferably, said reference voltage outputting means outputs a voltage obtained by dividing the differential voltage of said top voltage and said bottom voltage by a predetermined factor of at least $(2^N)$.

In the present invention, the output voltage of the reference voltage output means is set so that the conversion characteristic of the analog/digital converter becomes a predetermined characteristic.

Alternatively, said reference voltage outputting means equally divides the differential voltage of said top reference voltage and said bottom reference voltage into at least $(2^N)$.

In the present invention, the output voltage of the reference voltage outputting means is set so that the conversion characteristic of the analog/digital converter becomes linear.

More preferably, said calibration voltage range detecting means is formed in physical dimensions larger than the physical dimensions of said $(2^N-1)$ comparing means in an integrated circuit.

In the present invention, the comparator used for the calibration voltage range detecting means is formed larger than the comparators of the comparing means.

Alternatively, said calibration voltage range detecting means is comprised of a plurality of second comparing means formed in the same physical dimensions as said $(2^N-1)$ number of comparing means in an integrated circuit and receiving as input the same input signals and a majority value computing means for computing a majority value of outputs of the plurality of second comparing means.

In the present invention, the calibration voltage range detecting means is determined by the majority value of a plurality of comparators formed to the same size as the comparators of the comparing means.

BRIEF DESCRIPTION OF THE DRAWINGS

These and other objects and features of the present invention will become clearer from the following description of the preferred embodiments given with reference to the attached drawings, wherein:

FIG. 10 is a flow chart of a reference voltage reselection routine.

DESCRIPTION OF The PREFERRED EMBODIMENTS

Preferred embodiments of the present invention will be described in detail below while referring to the attached figures.

Figure 1:
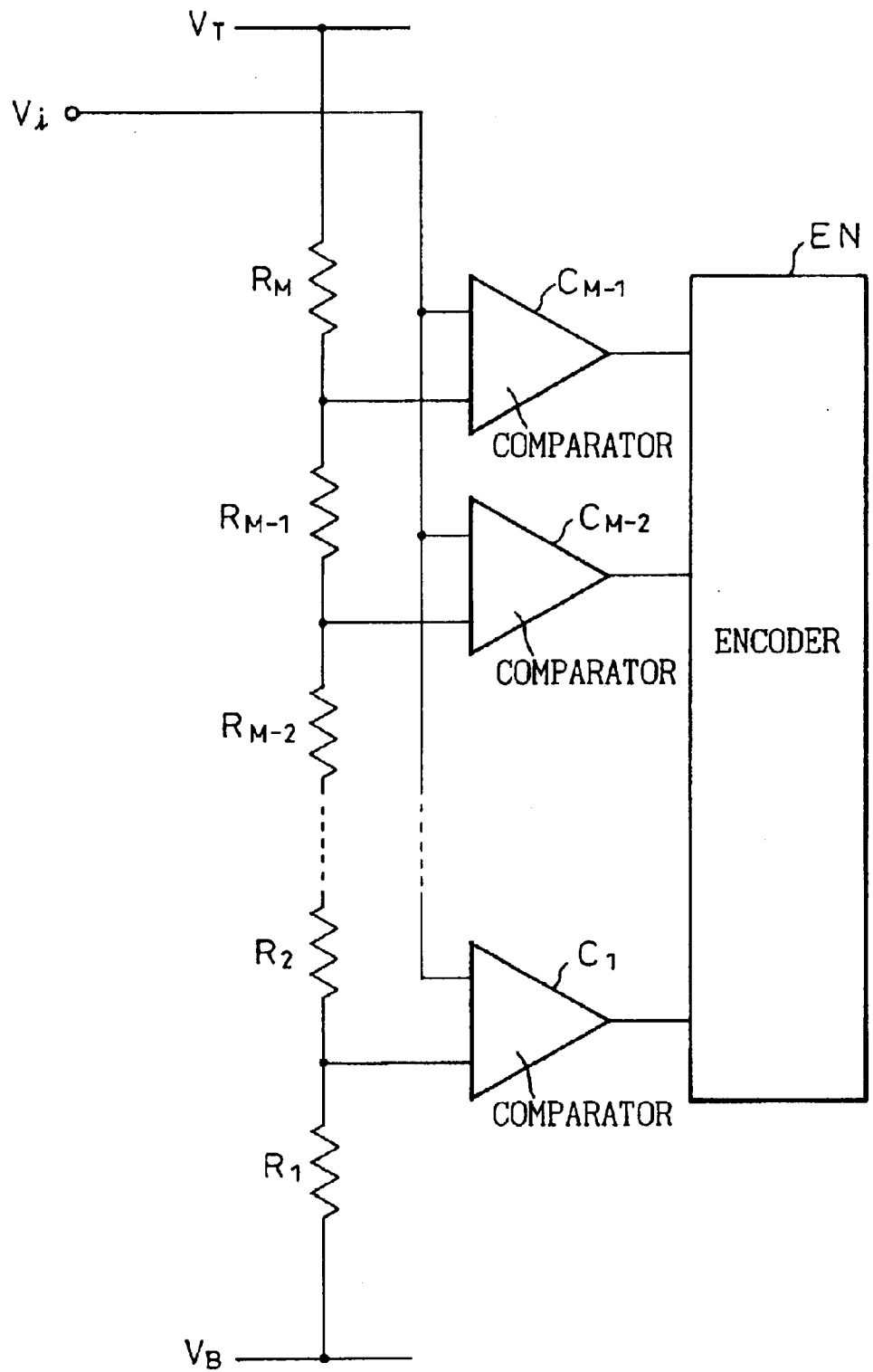
FIG. 1 is a view of the basic configuration of a flash-type analog/digital converter.
Figure 2:
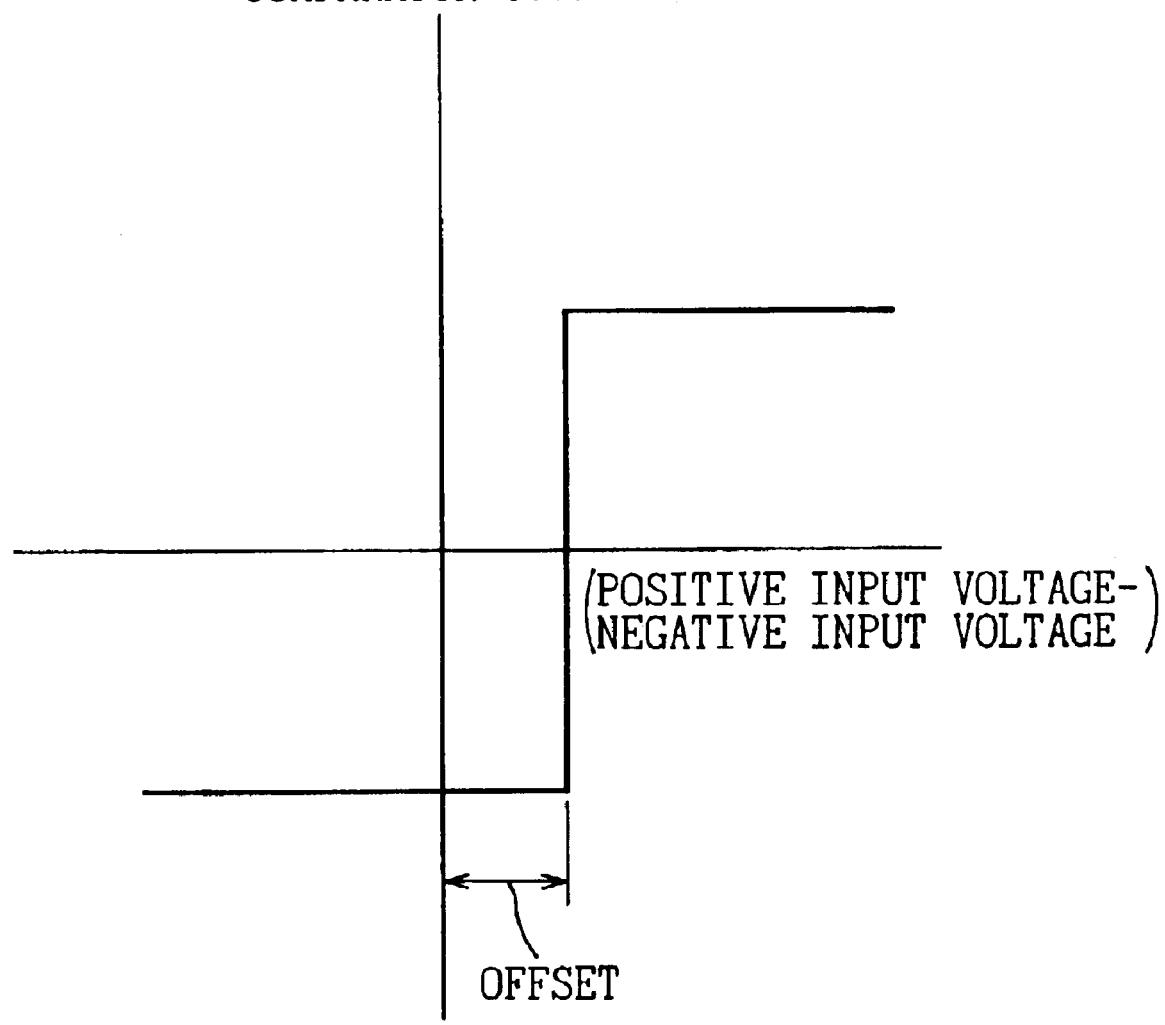
FIG. 2 is a view explaining the operation characteristics of a comparator.
Figure 3:
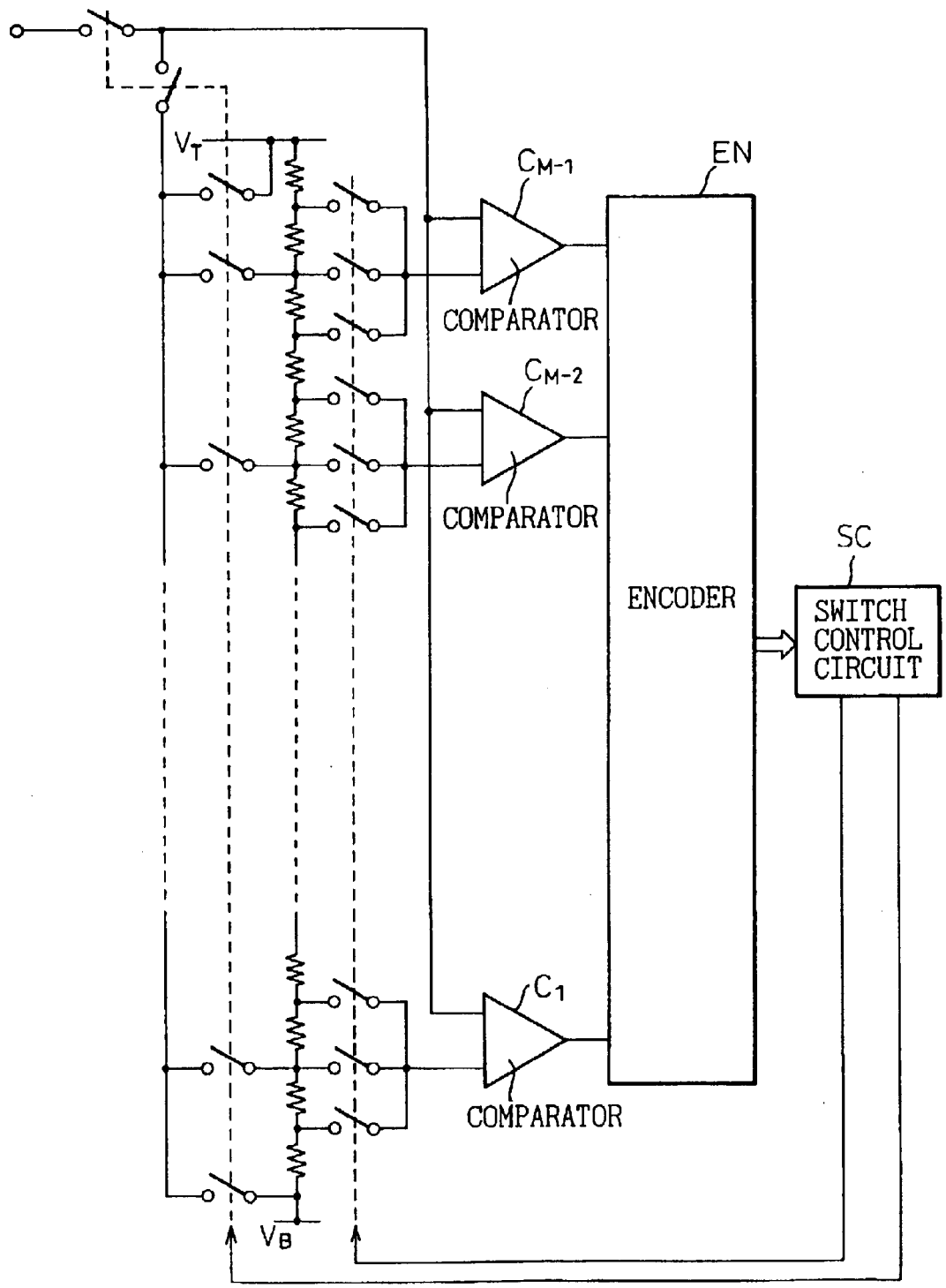
FIG. 3 is a view of the configuration of an analog/digital converter of the related art.
Figure 4:
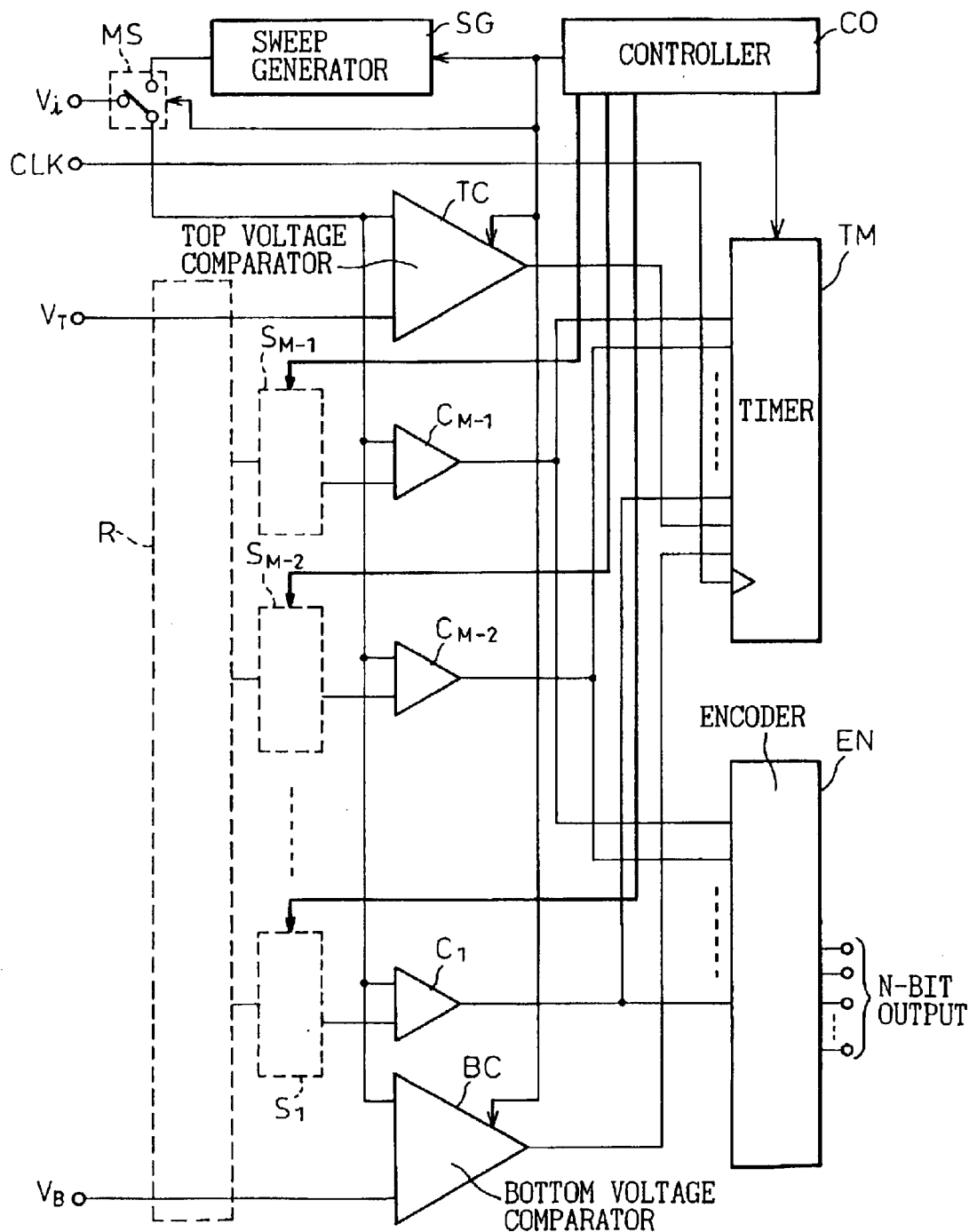
FIG. 4 is a view of the basic configuration of an analog/digital converter according to the present invention.

FIG. 4 is a view of the basic configuration of an analog/digital converter according to the present invention. The analog/digital converter is provided with a top voltage comparator TC, bottom voltage comparator BC, (M−1) number of comparators $C_1, C_2 \ldots C_{m-1}$ when the number of output bits of the analog/digital converter is N and $M=2^N$, switch circuits $S_1, S_2 \ldots S_{M-1}$ provided corresponding to the comparators, a reference voltage output circuit R, sweep generator SG, controller CO, timer TM, encoder EN, and mode switch MS.

First, the mode switch MS has the function of changing between a voltage measurement mode and calibration mode. It switches the voltage to be applied to one-side input terminals of the (M−1) number of comparators $C_1, C_2 \ldots C_{M-1}$ between the input voltage $V_i$ supplied from the outside and the calibration voltage $V_R$ output from the sweep generator SG.

That is, the common terminal of the mode switch MS is connected to one-side input terminals of the (M−1) number of comparators $C_1, C_2 \ldots C_{M-1}$ and one-side input terminals of the top voltage comparator TC and bottom voltage comparator BC.

The top voltage comparator TC inverts its output when the voltage to be output from the common terminal of the mode switch MS becomes more than the top voltage $V_T$ generated at a not shown top voltage generation circuit. Note that the top voltage comparator TC is made active by the controller CO at the calibration mode.

The bottom voltage comparator BC inverts its output when the voltage to be output from the common terminal of the mode switch MS becomes more than the bottom voltage $V_B$ generated at a not shown bottom voltage generation circuit. Note that the bottom voltage comparator BC is made active by the controller CO at the calibration mode.

The other terminals of the comparators $C_1, C_2 \ldots C_{M-1}$ is connected to the reference voltage output circuit R through the corresponding switch circuits $S_1, S_2 \ldots S_{M-1}$.

The outputs of the top voltage comparator TC and bottom voltage comparator BC and the outputs of the comparators $C_1, C_2 \ldots C_{M-1}$ are connected to the timer TM.

The outputs of the comparators $C_1, C_2 \ldots C_{M-1}$ are also connected to the encoder EN.

Figure 5:
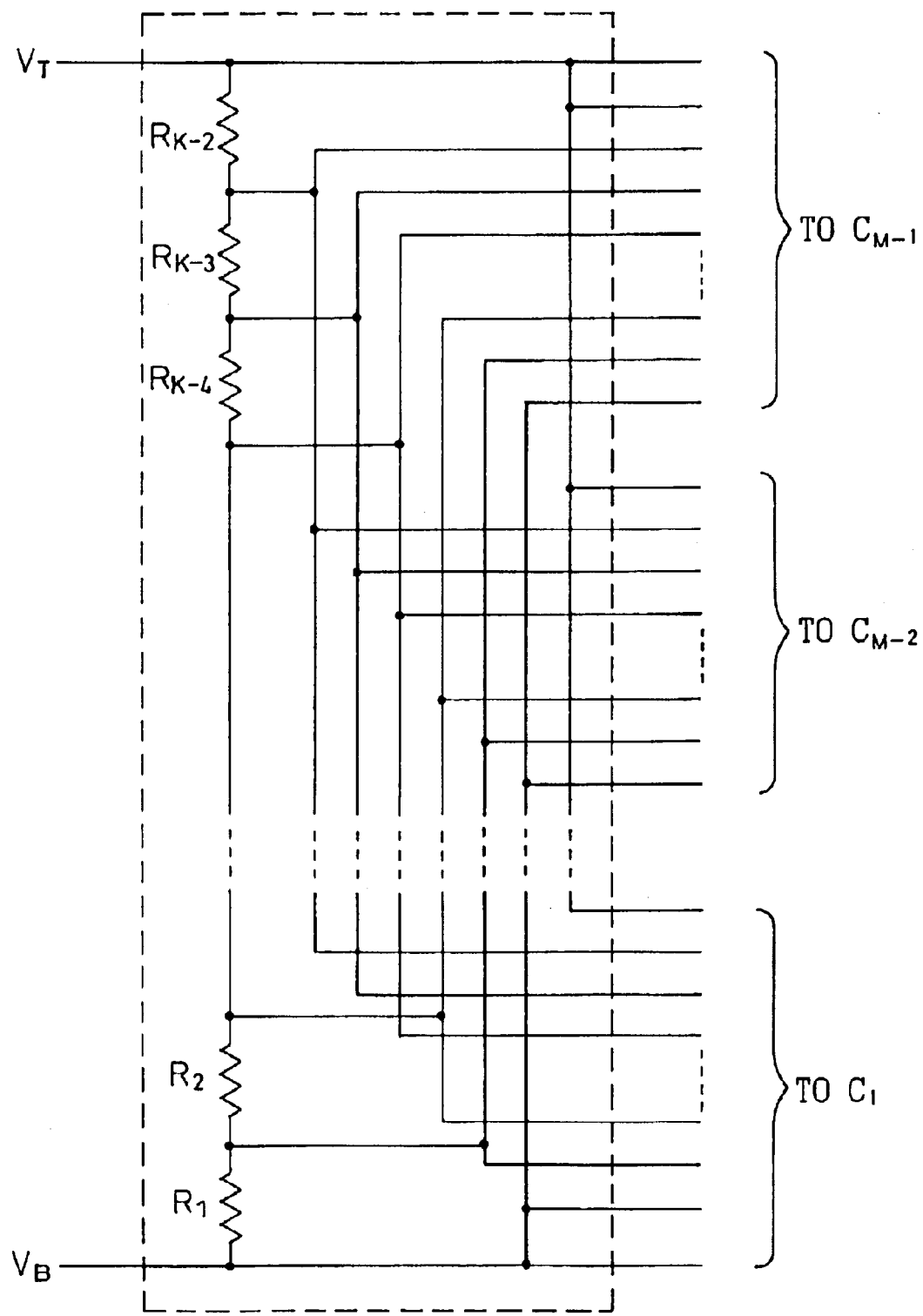
FIG. 5 is a detailed circuit diagram of a reference voltage output circuit.

FIG. 5 is a detailed circuit diagram of a reference voltage output circuit R. K ($K \geq M$) number of resistances $R_1, R_2 \ldots R_K$ are connected in series between the top voltage $V_T$ and bottom voltage $V_B$. Further, the total (K+1) number of voltages of the voltages of the (K−1) number of division points, the top voltage $V_T$, and bottom voltage $V_B$ are supplied as reference voltages to the switch circuits $S_1, S_2 \ldots S_{M-1}$.

Figure 6:
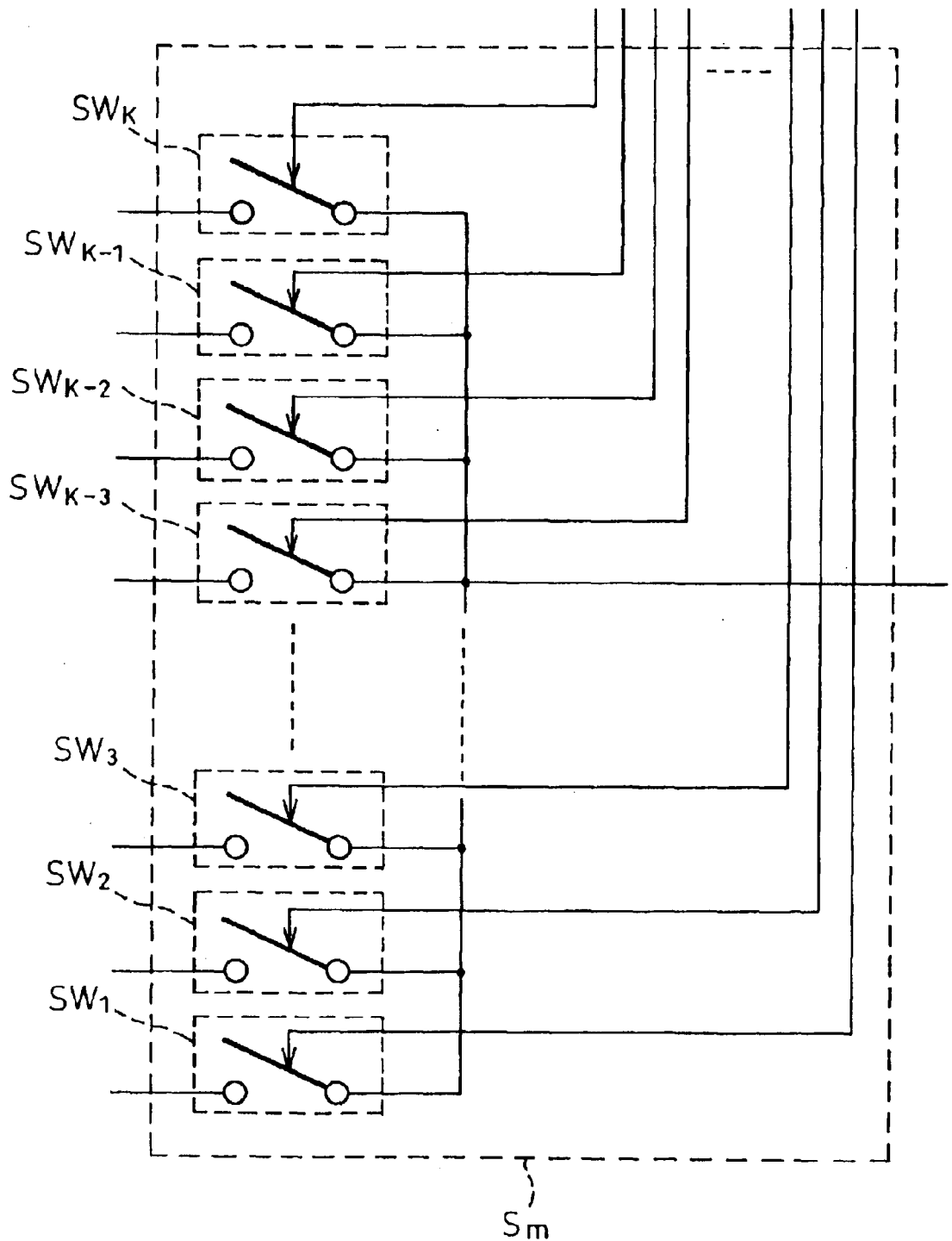
FIG. 6 is a a detailed circuit diagram of a switch circuit.

FIG. 6 is a detailed circuit diagram of one switch circuit $S_m$ among the switch circuits $S_1, S_2 \ldots S_{M-1}$ provided corresponding to the comparators $C_1, C_2 \ldots C_{M-1}$. (K+1) number of switches $SW_1, SW_2 \ldots SW_{K+1}$ are arranged in parallel for each switch circuit $S_m$. One-side terminals of the switches $SW_1, SW_2 \ldots SW_{K+1}$ are connected in common to the other input terminals of the comparators $C_1, C_2 \ldots C_{M-1}$.

Further, the other input terminals of the switches $SW_1, SW_2 \ldots SW_{K+1}$ are connected to the (k+1) number of reference voltages. Further, the operations of the switches $SW_1, SW_2 \ldots SW_{K+1}$ are controlled by the controller CO at the calibration mode.

The encoder EN encodes the outputs of the (M−1) number of comparators $C_1, C_2 \ldots C_{M-1}$ to an N-bit signal and outputs the same as the output signal of the analog/digital converter.

The timer TM starts counting the time when the output of the bottom voltage comparator BC is inverted, then counts the time when the outputs of the (M−1) number of comparators $C_1, C_1 \ldots C_{M-1}$ are inverted, and ends the counting of the time when the output of the top voltage comparator TC inverts. Note that the timer TM counts the time using a clock signal CLK from a not shown clock pulse generation circuit.

Further, the operation at the calibration mode is controlled by the controller CO.

Figure 7:
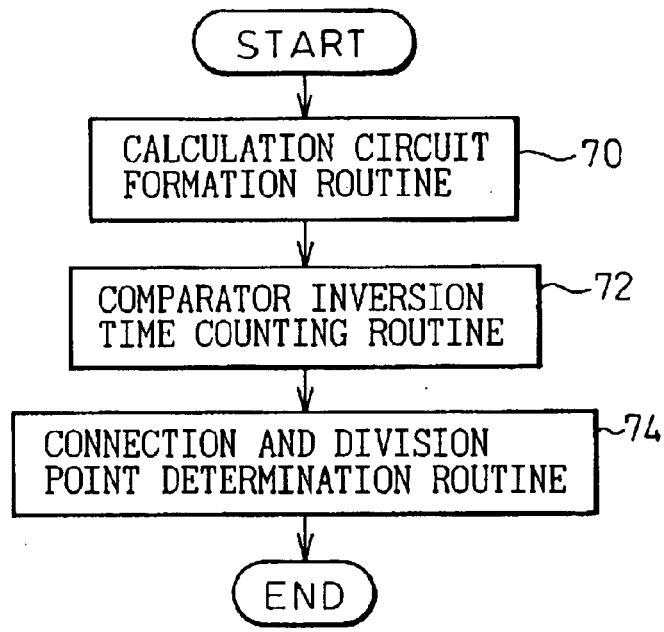
FIG. 7 is a flow chart of a calibration mode control routine.

FIG. 7 is a flow chart of a calibration mode control routine executed by the controller CO. At step 70, a calibration circuit formation routine is executed, at step 72, a comparator inversion time counting routine is executed, and at step 74 a connection and division point determination routine is executed.

Figure 8:
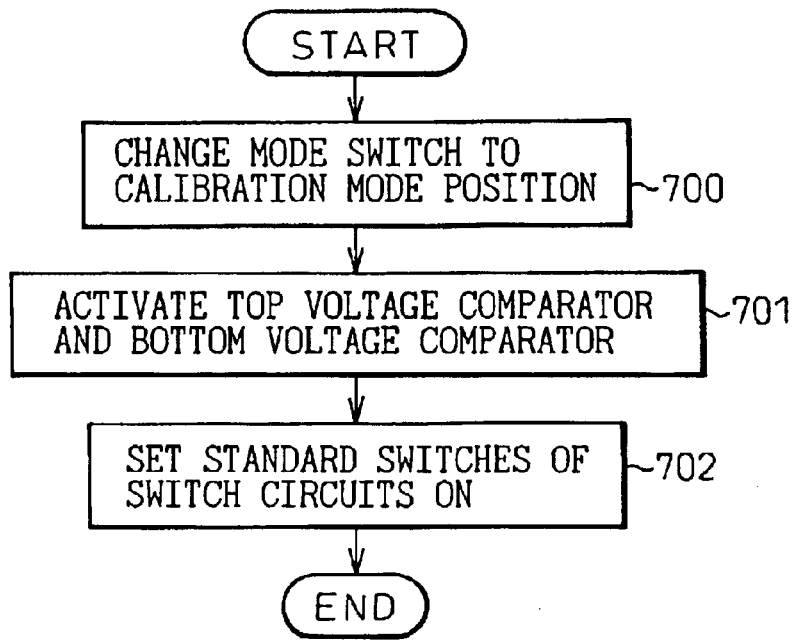
FIG. 8 is a detailed flow chart of a calibration circuit formation routine.

FIG. 8 is a detailed flow chart of a calibration circuit formation routine executed at step 70 of the calibration mode control routine. First, at step 700, the mode switch MS is changed to the calibration mode position.

Next, at step 701, the top voltage comparator TC and the bottom voltage comparator BC are activated, then at step 702, the standard switches of the switch circuits $S_1, S_2 \ldots S_{K+1}$ are set "ON".

Here, a "standard switch" of a switch circuit $S_k$ (k=1, 2 ..., K+1) means a switch for supplying a reference voltage for inverting the output of a comparator $C_m$ to the other terminal of the comparator $C_m$ when there is no offset in the comparator $C_m$ (m=1, 2 ..., (M−1)) to the other terminal of the comparator $C_m$. In particular, when K=M, the switch $SW_{m+1}$ of the switch circuit $S_m$ corresponding to the comparator $C_m$ becomes the standard switch.

Figure 9:
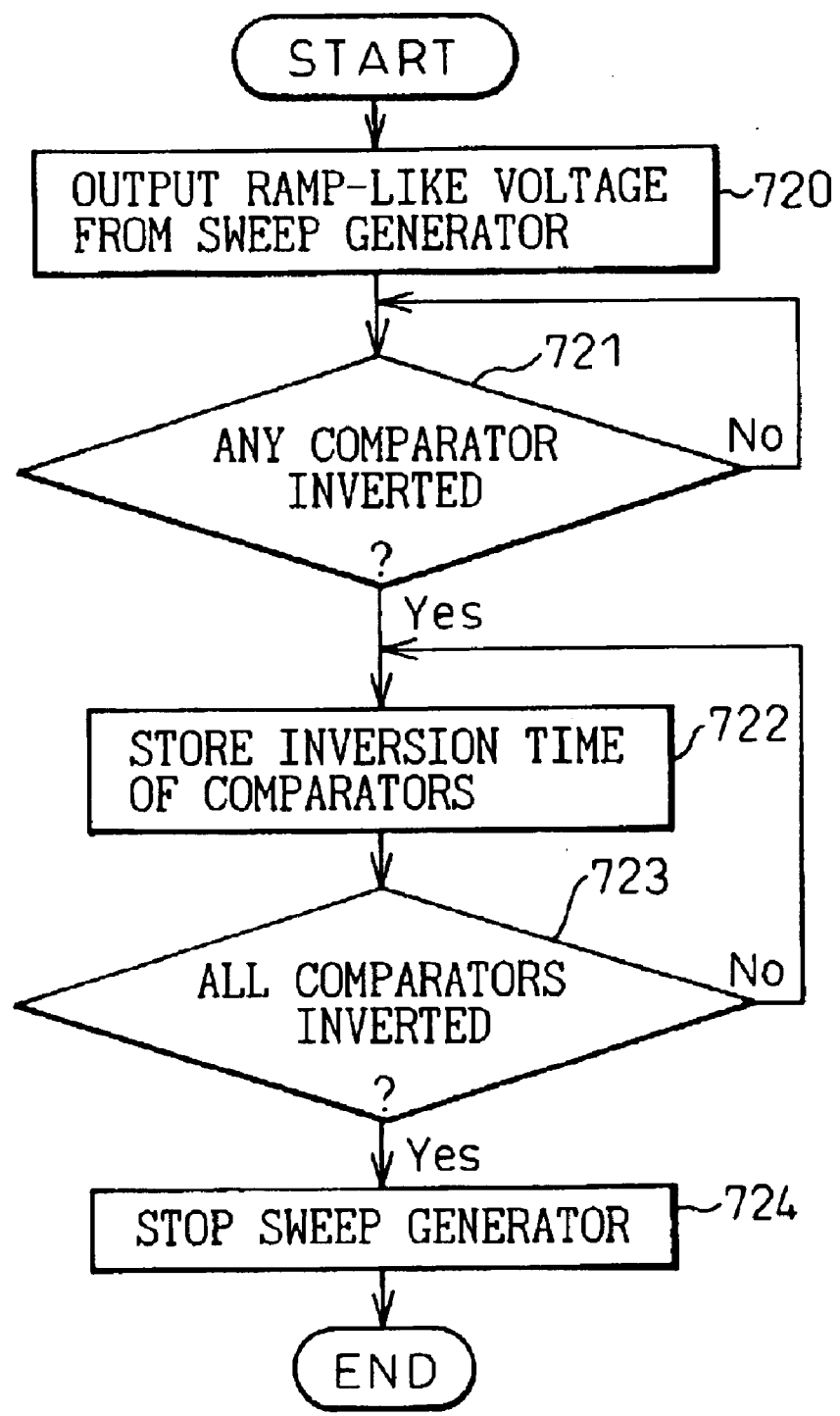
FIG. 9 is a flow chart of a comparator inversion time counting routine.

FIG. 9 is a flow chart of a comparator inversion time counting routine executed at step 72 of the calibration mode control routine. At step 720, the generation of the calibration voltage $V_R$ changing in a ramp shape from the sweep generator SG is started.

At step 721, it is awaited until any one of the top voltage comparator TC, bottom voltage comparator BC, and comparator $C_m$ inverts.

When inversion of the output of any comparator is detected at step 721, at step 722, the time $t_m$ from when the output of the bottom voltage comparator BC inverts to when the output of the comparator $C_m$ inverts is stored.

At step 723, it is detected if the output of the top voltage comparator TC has inverted and the voltage $V_R$ output from the sweep generator SG has become more than the top voltage $V_T$. Step 721 is repeated until the outputs of all of the comparators are inverted.

When it is confirmed at step 723 that all of the top voltage comparator TC, bottom voltage comparator BC, and the comparator $C_m$ have inverted, at step 724, the generation of the calibration voltage $V_R$ by the sweep generator SG is stopped and the routine is ended.

Note that the above assumes that the output voltage of the sweep generator SG changes in a ramp shape from the low voltage to the high voltage, but the output voltage of the sweep generator SG may also change from the high voltage to the low voltage. In this case, the processings of steps 721 and 723 have to be reversed.

FIG. 10 is a flow chart of a reference voltage reselection routine executed at step 74 of the calibration mode control routine. At step 740, the time $t_m$ until the output of the comparator $C_m$ inverts is converted to an inversion voltage $V_{cm}$ at which the output inverts at the comparator $C_m$ by the following equation:

$$V_{cm} = (V_T - V_B) t_m / t_B + V_B$$

Here, $t_B$ is the time from when the calibration voltage $V_R$ output from the sweep generator SG becomes more than the bottom voltage $V_B$ to when it becomes the top voltage $V_T$.

Next, at step 41, the offset voltage $\Delta V_m$ of the comparator $C_m$ is converted by the following equation:

$$\Delta V_m = V_{rm} - V_{cm}$$

Here, $V_{rm}$ is the standard reference voltage at which the output should be inverted when the comparator $C_m$ has no offset.

At step 742, it is judged if the absolute value of the offset voltage $\Delta V_m$ has become more than a predetermined threshold value $\delta$.

When the judgement at step 742 is "Yes", that is, when the absolute value of the offset voltage $\Delta V_m$ has become more than the predetermined threshold value $\delta$, the reference voltage is reselected at step 743.

That is, the switch $SW_j$ to be turned on in place of the standard switch $SW_{m+1}$ for correcting the offset voltage $\Delta V_m$ to within the threshold value $\delta$ is determined.

"j" is determined by the following equation.

$$j = (m+1) + [\Delta V_m / \Delta V]$$

Here, $\Delta V$ is the amount of change of the standard voltage when moving the connection and division point position to one top voltage comparator side, and [X] is an operator for calculating the maximum whole number not more than X. For example, if X is "2.3", [X]=2, while if "−1.7", [X]=−2.

When the processing at step 743 ends and when the judgement at step 742 is "No", that is, when the absolute value of the offset voltage $\Delta V_m$ is less than the predetermined threshold value $\delta$, the routine proceeds to step 744 where it is judged if the reference voltage has been reselected for all comparators.

When the judgement is "No" at step 744, that is, when the connection and division point position has not been determined for all comparators, the processing of steps 740 to 743 is repeated. Conversely, when the judgement at step 744 is "Yes", that is, when the connection and division point position has been determined for all comparators, this routine is ended.

Here, the connection and division point positions of the comparators determined in the calibration mode are stored in the memory included in the controller CO. Note that the memory is normally a RAM, but it may also be a fuse ROM.

That is, in the case of a RAM, the stored content ends up being lost when the power is turned off, so calibration is necessary each time the power is turned on, but there is the advantage that calibration is possible matching the surrounding environment when the power is turned on. In the case of a fuse ROM, the advantage arises that if calibration is performed at the time of shipment, subsequent calibration is no longer needed.

That is, according to the analog/digital comparator of the present invention, it is possible to determine the connection and division point positions for making the offset less than the threshold value for all comparators and shorten the calibration time by just generating a calibration voltage $V_R$ once from the sweep generator.

Further, according to the analog/digital converter of the present invention, it is possible to select a reference voltage minimizing the offset from the (K+1) types of reference voltages for each comparator $C_m$, so it becomes possible to adjust the offset to less than the threshold value even when lowering the voltage of the power supply and the offset of the comparator $C_m$ becomes relatively large.

Further, according to the analog/digital converter according to the present invention, the inversion voltage is not determined based on the output of the analog/digital converter, that is, the encoder output, as in the related art. The inversion voltage is determined based on the inversion time of the comparator $C_m$ counted by the timer TM, so even when comparators with large offsets and comparators with small offsets are mixed together, it becomes possible to adjust the offset to less than the threshold value for each comparator $C_m$.

Note that as clear from the above explanation, since the inversion time $t_m$ of the comparator $C_m$ is counted based on the inversion timings of the top voltage comparator TC and bottom voltage comparator BC, it is required that the top voltage comparator TC and the bottom voltage comparator BC invert their outputs accurately at the top voltage $V_T$ and the bottom voltage $V_B$, that is, that the offsets of the top voltage comparator TC and the bottom voltage comparator BC be small.

The top voltage comparator TC and the bottom voltage comparator BC are both built into the same integrated circuit as the comparator $C_m$, but it is advantageous to apply at least one of the following two measures to reduce the offsets of the top voltage comparator TC and bottom voltage comparator BC:

(1) Making the physical sizes of the top voltage comparator TC and the bottom voltage comparator BC larger than the comparator $C_m$. This is because if making the physical sizes large in the integrated circuit, the sizes of the complementary transistors placed at the inputs of the comparators also become larger, so the variation in transistors becomes smaller.

(2) Making the physical sizes of the top voltage comparator TC and the bottom voltage comparator BC the same as the physical size of the comparator $C_m$. The top voltage comparator TC and the bottom voltage comparator BC form a majority circuit with the parallel connection of the plurality of comparators. By making the result of the majority operation of the output of the plurality of comparators the output, the offset can be made smaller.

Above, the explanation was made in particular of the case where K=M. In this case, the comparators arranged at the center portions inside the (M−1) number of comparators can adjust the offset over a wide range, but at the comparator adjoining the top voltage comparator TC, there is one changeable division position at the top voltage comparator TC, while at the comparator adjoining the bottom voltage comparator BC, there is one changeable division position at the bottom voltage comparator BC side. That is, the selectable division points at the positive side and negative side are reduced the closer to the top voltage comparator TC and the bottom voltage comparator BC.

To solve this problem, it is possible to increase the number of selectable reference voltages by making K>M and arranging a plurality of resistances between the comparators adjoining the top voltage bus and top voltage comparator TC and the comparators adjoining the bottom voltage bus and bottom voltage comparator BC.

For example, it is possible to make K=M+4 and add two resistances each between the top voltage bus and comparator adjoining the top voltage comparator TC and between the bottom voltage bus and bottom voltage comparator BC. The comparator adjoining the top voltage comparator TC can add two selectable division points to the top voltage comparator TC side, while the comparator adjoining the bottom voltage comparator BC can add two to the bottom voltage comparator BC side.

In the above explanation, the analog/digital converter was assumed to be one outputting a digital signal in a proportional relationship with the input voltage $V_i$, but the resistance values of the serial resistances R are all the same. The division points before adjustment of the offset are set at equal intervals.

In the present invention, by setting division points before adjustment of offset at unequal intervals, it is possible to output digital signals in a predetermined functional relationship with the input voltage $V_i$.

Summarizing the effects of the invention, according to the analog/digital converter of the present invention, not only does it become possible to complete calibration by outputting a single ramp-like voltage by a sweep generator, but also it becomes possible to correct offset of comparing means even when using a low power supply voltage by enlarging the selection range of reference voltage.

While the invention has been described with reference to specific embodiments chosen for purpose of illustration, it should be apparent that numerous modifications could be made thereto by those skilled in the art without departing from the basic concept and scope of the invention.

What is claimed is:

1. An analog/digital converter for converting an analog voltage to N bits of a digital signal, comprising:

($2^N$−1) comparing means, each comparing means having a first input terminal and a second input terminal;

reference voltage outputting means for dividing a differential voltage of a top voltage and a bottom voltage into at least ($2^N$) sections and outputting at least ($2^N$−1) calibration reference voltages, each of the ($2^N$−1) calibration reference voltages applied to the second input terminal of a corresponding comparing means of the ($2^N$−1) comparing means, in a calibration mode;

calibration voltage outputting means for outputting a ramp-like voltage to the first input terminal of each of said ($2^N$−1) comparing means in the calibration mode;

calibrating means for selecting a corresponding reference voltage to be supplied to the second input terminal of the corresponding said comparing means causing the corresponding said comparing means to invert the corresponding said calibration reference voltage output from said reference voltage outputting means supplied to its second input terminal, when the ramp-like voltage of said calibration voltage outputting means reaches the corresponding said calibration reference voltage supplied to the second input terminal of the corresponding said comparing means; and reference voltage applying means for applying said corresponding reference voltage selected by said calibrating means to the second input terminal of the corresponding said comparing means.

2. An analog/digital converter as set forth in claim 1, wherein said calibrating means comprises:

reference voltage selecting means for selecting one predetermined voltage from the reference voltages output from said reference voltage outputting means and applying it to the second input terminal of the corresponding said comparing means;

calibration voltage range detecting means for detecting if the ramp-like voltage of said calibration voltage outputting means is in a predetermined range from said bottom voltage to said top voltage;

inversion time counting means for counting an inversion time from when the ramp-like voltage of said calibration voltage outputting means becomes more than said bottom voltage to when the outputs of said bottom voltage to when the outputs of said corresponding comparing means invert, wherein inversion of the corresponding said comparing means is detected by said calibration voltage range detecting means while the output voltage of said calibration voltage detecting means is in said predetermined range;

converting means for converting said inversion time counted by said inversion time counting means to an inversion voltage after the fact that the output voltage of said calibration voltage outputting means has become more than said top voltage, detected by said calibration voltage range detecting means; and reference voltage reselecting means for reselecting a reference voltage to be applied to the second input terminal of the corresponding said comparing means from the voltages of said reference voltage outputting means when a differential voltage of the inversion voltage calculated by said converting means and the reference voltage selected by said reference voltage selecting means and applied to the second input terminal of the corresponding said comparing means is more than a predetermined threshold voltage.

3. An analog/digital converter as set forth in claim 1 or 2, wherein said reference voltage outputting means outputs a voltage obtained by dividing the differential voltage of said top voltage and said bottom voltage by a predetermined factor of t least ($2^N$).

4. An analog/digital converter as set forth in claim 1 or 2, wherein said reference voltage outputting means equally divides the differential voltage of said top reference voltage and said bottom reference voltage into at least ($2^N$).

5. An analog/digital converter as set forth in claim 2, wherein said calibration voltage range detecting means is formed in physical dimensions larger than the physical dimensions of said ($2^N$−1) comparing means in an integrated circuit.

6. An analog/digital converter as set forth in claim 2, wherein said calibration voltage range detecting means is comprised of:

a plurality of second comparing means formed in a same physical dimensions as said ($2^N$–1) comparing means in an integrated circuit and receiving as input the same input signals; and majority value computing means for computing a majority value of outputs of the plurality of second comparing means.

7. A method for calibrating an analog/digital converter for converting an analog voltage to N bits of a digital signal, the method comprising:

providing ($2^N$–1) comparators, each comparator having a first input terminal and a second input terminal;

dividing the difference voltage between a top voltage and a bottom voltage into at least ($2^N$) sections;

outputting at least ($2^N$–1) calibration reference voltages from said difference voltage division;

applying a corresponding reference voltage of the ($2^N$–1) calibration reference voltages to the second input terminal of a corresponding comparator of the ($2^N$–1) comparators, in a calibration mode;

outputting a ramp-like voltage to the first input terminal of each of said ($2^N$–1) comparators in the calibration mode;

selecting a corresponding reference voltage to be supplied to the second input terminal of the corresponding said comparator when the corresponding said comparator inverts the corresponding said calibration reference voltage supplied to its second input terminal, while the ramp-like voltage reaches the corresponding said calibration reference voltage; and applying said selected corresponding reference voltage to the second input terminal of the corresponding said comparator.

8. An analog/digital converter for converting an analog voltage to N bits of a digital signal, comprising:

($2^N$–1) comparators, each comparator having a first input terminal and a second input terminal;

a reference voltage circuit for dividing the difference voltage between a top voltage and a bottom voltage into at least ($2^N$) sections and outputting at least ($2^N$–1) calibration reference voltages, each of the ($2^N$–1) calibration reference voltages applied to the second input terminal of a corresponding comparator of the ($2^N$–1) comparators, in a calibration mode;

a calibration voltage circuit for outputting a ramp-like voltage to the first input terminal of each of said ($2^N$–1) comparators in the calibration mode;

a calibrating circuit for selecting a corresponding reference voltage to be supplied to the second input terminal of the corresponding said comparator to invert the corresponding calibration said reference voltage supplied to the second input terminal of the corresponding said comparator, when the ramp-like voltage reaches the corresponding said calibration reference voltage supplied to the second input terminal of the corresponding said comparator; and a switch circuit for applying said selected corresponding reference voltage to the second input terminal of the corresponding said comparator.

* * * * *

UNITED STATES PATENT AND TRADEMARK OFFICE
CERTIFICATE OF CORRECTION

PATENT NO. : 6,778,124 B2
DATED : August 17, 2004
INVENTOR(S) : Hashimoto et al.

It is certified that error appears in the above-identified patent and that said Letters Patent is hereby corrected as shown below:

Title page,
Item [56], References Cited, U.S. PATENT DOCUMENTS, delete "4,395,732 A * 7/1983 Upton.....341/120" insert -- 4,395,732 A * 7/1983 Upton.......348/27 --
Item [57], ABSTRACT,
Line 5, delete "(l $\leqq$ i $\leqq$ M) insert -- (l≤i≤M) --
Line 9, delete "comparators", insert -- comparator --

Column 10,
Line 57, delete "of t least", insert -- of at least --

Signed and Sealed this

Fifth Day of July, 2005

JON W. DUDAS
*Director of the United States Patent and Trademark Office*

UNITED STATES PATENT AND TRADEMARK OFFICE
CERTIFICATE OF CORRECTION

PATENT NO. : 6,778,124 B2
DATED : August 17, 2004
INVENTOR(S) : Hashimoto et al.

It is certified that error appears in the above-identified patent and that said Letters Patent is hereby corrected as shown below:

Title page,
Item [56], References Cited, U.S. PATENT DOCUMENTS, delete "4,395,732 A * 7/1983 Upton......341/120", insert -- 4,395,732 A * 7/1983 Upton......348/27 --
Item [57], ABSTRACT,
Line 5, delete "(l $\leqq$ i $\leqq$ M)", insert -- (l$\leq$i$\leq$M) --
Line 9, delete "comparators", insert -- comparator --

Column 10,
Line 57, delete "of t least", insert -- of at least --

Signed and Sealed this

Twelfth Day of July, 2005

JON W. DUDAS
*Director of the United States Patent and Trademark Office*